United States Patent [19]
Allan et al.

[11] Patent Number: 6,111,800
[45] Date of Patent: Aug. 29, 2000

[54] PARALLEL TEST FOR ASYNCHRONOUS MEMORY

[75] Inventors: James D. Allan; John J. Silver, both of Colorado Springs; Keith A. Ford, Coloradao Springs, all of Colo.

[73] Assignee: Cypress Semiconductor Corporation, San Jose, Calif.

[21] Appl. No.: 08/985,890

[22] Filed: Dec. 5, 1997

[51] Int. Cl.$^7$ .................................................. G11C 7/00
[52] U.S. Cl. ............... 365/201; 365/189.02; 365/189.08; 365/200
[58] Field of Search .................................. 365/201, 200, 365/230.02, 189.02, 189.08

[56] References Cited

U.S. PATENT DOCUMENTS

| | | | |
|---|---|---|---|
| 4,609,777 | 9/1986 | Cargile | 178/22.08 |
| 4,951,254 | 8/1990 | Ontrop et al. | 365/201 |
| 5,202,853 | 4/1993 | Choi | 365/201 |
| 5,265,100 | 11/1993 | McClure et al. | 371/21.2 |
| 5,285,419 | 2/1994 | Iyengar | 365/201 |
| 5,349,249 | 9/1994 | Chiang et al. | 307/465 |
| 5,373,509 | 12/1994 | Katsura | 371/21.2 |
| 5,383,157 | 1/1995 | Phelan | 365/201 |
| 5,394,369 | 2/1995 | Kagami | 365/200 |
| 5,406,566 | 4/1995 | Obara | 371/21.2 |
| 5,471,480 | 11/1995 | You | 371/21.2 |
| 5,515,381 | 5/1996 | Chan | 371/37.7 |
| 5,535,163 | 7/1996 | Matsui | 365/201 |
| 5,557,619 | 9/1996 | Rapoport | 371/22.5 |
| 5,677,881 | 10/1997 | Seo et al. | 365/200 |
| 5,732,029 | 3/1998 | Lee et al. | 365/200 |

OTHER PUBLICATIONS

Junji Nishimura, "New Testing Devices Are Responding To Higher Performance in Megabit Age", *JEE Hi–Tech Report: Memory Testing Technology*, pp. 96–101 (Jan. 1989).

Greg Billus and Lynn Youngs, "Test of UltraSPARC™–I embedded RAMs, register files and TLBs", *Texas Instruments Technical Journal*, vol. 13, No. 3, pp. 100–109 (May–Jun. 1996).

T. Fujieda and N. Zenke, "Testing Asynchronous Devices", *International Test Conference*, Paper 36.3, pp. 871–875 (1987).

Hiroki Koike et al., "BIST Circuit Macro Using Microprogram ROM LSI Memories", *IEICE Trans. Electron.*, vol. E78–C., No. 7, pp. 838–844 (Jul. 1995).

P.K. Lala and A. Walker, "An on–Chip Test Scheme for SRAMs", *IEEE International Workshop on Memory Technology, Design and Testing*, pp. 16–28 (1994).

Hiroyuki Goto et al., "A 3.3–V 12–ns 16–Mb CMOS SRAM", *Journal of Solid–State Circuits*, vol. 27, No. 11, pp. 1490–1495 (1992).

(List continued on next page.)

*Primary Examiner*—Richard Elms
*Assistant Examiner*—Hien Nguyen
*Attorney, Agent, or Firm*—Wagner, Murabito & Hao LLP

[57] ABSTRACT

An asynchronous memory device includes parallel test circuitry configured to provide a measure of a slowest bit access time for the device. The parallel test circuitry may include first circuitry configured to receive logic signals from a plurality of cells of the device and to provide first output signals indicative of logic states of the plurality of cells. The parallel test circuitry may also include second circuitry configured to receive the fist output signals and to produce second output signals indicative of logic states of the first output signals therefor The parallel test circuitry may be the same circuitry used in the read path of the memory device, and may be configured such that the second output signals are produced at the slowest bit access time. The plurality of cells tested may include a redundant cell of the device. Such redundancy is transparent to the test circuitry. In a further embodiment, a plurality of cells of an asynchronous memory device may be read in parallel and an output signal indicative of a logical combination of logic states of the plurality of cells and a test signal at the speed of the slowest cell access time produced thereby.

9 Claims, 4 Drawing Sheets

OTHER PUBLICATIONS

Hugh McAdams et al., "A 1–Mbit CMOS Dynamic RAM With Design–For Test Functions", *Journal of Solid–State Circuits,* vol. SC–21, pp. 635–642, No. 5, Oct. 1986.

Jun'ichi Inoue et al., "Parallel Testing Technology For VLSI Memories", *International Test Conference,* Paper 45.1, pp. 1066–1071, (1987).

Masaki Kumanoya et al., A 90ns 1Mb DRAM with Multi–Bit Test Mode, *Session XVII: Megabit DRAMs International Solid–State Circuits Conference,* pp. 240–241 (Feb. 15, 1985).

Takashi Ohsawa et al., "A 60–ns Mbit CMOS DRAM with Built–In Self–Test Function", *Journal of Solid–State Circuits,* vol. SC–22, No. 5, pp. 663–668 (Oct. 1987).

Toshio Takeshima et al., "A 55–ns 16–MB DRAM with Built–in Self Test Function Using Microprogram ROM", *Journal of Solid–State Circuits,* vol. 25, No. 4, pp. 903–911 (Aug. 1990).

Hiroki Koike et al., "A Bist Scheme Using Microprogram ROM For Large Capacity Memories", *International Test Conference,* Paper 36.1, pp. 815–822 (1990).

Narumi Sakashite et al., "A Built–In–Self–Test Circuit with Timing Margin Test Function in a 1Gbit Synchronous DRAM", *International Test Conference,* Paper 11.3, pp. 319–324 (1996).

Stefano Barbagallo et al., "Industrial BIST of Embedded RAMs", *IEEE Design & Test of Computers,* pp. 86–95 (1995).

Stanley E. Schuster et al., "On–Chip Test Circuitry for a 2–ns Cycle, 512–kb CMOS ECL SRAM", *Journal of Solid–State Circuits,* vol. 27, No. 7, pp. 1073–1079 (Jul. 1992).

Zuxi Sun and Laung–Terng Wang, "Self–Testing of Embedded RAMs", *International Test Conference,* Paper 4.3, pp. 148–156 (1984).

Andre Ivanov, "Design For Testability and Built–In Self–Test of Integrated Circuits and Systems: How These Can Add Value to Your Products", *IEEE,* pp. 712–717 (1996).

PARALLEL TEST FOR ASYNCHRONOUS MEMORY

FIELD OF THE INVENTION

The present invention relates to memory devices, and, in particular, those devices which employ parallel test features.

BACKGROUND

Conventional memory devices, for example static random access memories (SRAMS) and dynamic random access memories (DRAMs), as are commonly used in computer systems, often include parallel test features. Such features allow a manufacturer to test the memory cells of the device more quickly. In general, each cell of the memory device is tested to determine whether it is functioning properly (i.e., whether it is properly retaining a stored state). For large memories (e.g., on the order of 1 Megabit or more), parallel testing allows multiple cells (or bits) of the memory to be tested at the same time. For example, instead of having to test each cell individually, parallel test features incorporated into the memory or other programmable device may allow a manufacturer to test four, eight, sixteen, etc. cells at a time, thus reducing the overall test time for the device (a factor which has been recognized as being a significant portion of the overall production costs of a memory device).

Although such "functional" (e.g., pass/fail) parallel testing for memory devices has been available (see, e.g., U.S. Pat. No. 5,383,157 entitled Parallel Testmode, assigned to the assignee of the present invention, the entire disclosure of which is incorporated herein by reference), such testing provides no indication of the so-called critical path timing of the device under test in the case of an asynchronous memory. The "critical path" is the path through the device which determines the access time. For synchronous memory devices, the presence of input and output registers that are under the control of a common clock signal tends to set the timing parameters rather than the performance of any test circuitry. To illustrate, consider the synchronous memory 10 shown in FIG. 1. Input data 12 is applied to the input port of an input register 14 and is Latched in the input register 14 in response to a clock signal 16. The data from input register 14 is written to a number of selected cells (e.g., four cells) of memory core 18 and the selected cells are programmed to retain the state of the data in signal 12. To test the functionality of the selected cells, the state of these cells is read by output register/test circuit 20 in response to a subsequent clock signal 16. Output register/test circuit 20 determines whether the state of each of the cells agrees with the state of the input data signal 12 and provides an indication of same as data out signal 22. Thus, data out signal 22 provides an indication as to whether there were any functional failures of the selected cells of memory core 18.

The signals from memory core 18 are latched in output register/test circuit 20 in response to clock signal 16 before they are tested. Thus, even the slowest of these signals has a predetermined time to set up before it is tested. Any timing differences between these signals is effectively masked by clock signal 16. Thus it can be seen that it is possible to easily add test circuitry to synchronous memories without impacting access, or clock to data output, time. In the case of asynchronous memories, the test circuitry itself must be configured to ensure that critical path timing is unaffected when test modes are invoked.

SUMMARY OF THE INVENTION

In one embodiment, the present invention provides an asynchronous memory with parallel test circuitry configured to provide a measure of a slowest bit access time for the device. The parallel test circuitry may include first circuitry configured to receive logic signals from a plurality of cells of the device and to provide first output signals indicative of logic states of the plurality of cells. The parallel test circuitry may also include second circuitry configured to receive the first output signals and to produce second output signals indicative of logic states of the first output signals therefrom. In such an embodiment, the parallel test circuitry may be the same circuitry used in the read path of the memory device, and may be configured such that the second output signals are produced at the slowest bit access time.

The plurality of cells tested may include a single or multiple redundant cells of the device. Such redundancy is transparent to the test circuitry.

In addition, the parallel test circuitry may be configured such that the first circuitry includes one or more circuits, each of which includes first and second input paths from a number of the plurality of cells. First logic circuitry may be coupled to the first and second input paths, the first logic circuitry being configured to provide the first output signals. The second circuitry may include second logic circuitry configured to receive the first output signals and a test signal and to provide the second output signals.

In a further embodiment, the present invention provides a method including the steps of reading a plurality of cells of an asynchronous memory device in parallel and producing an output signal indicative of their logic state at the speed of the slowest cell access time.

BRIEF DESCRIPTION OF THE DRAWINGS

The present invention is illustrated by way of example and not limitation in the figures of the accompanying drawings in which.

DETAILED DESCRIPTION

Described herein is a parallel test scheme for asynchronous memory devices. The present scheme allows for functional and critical path timing testing of memory cells of such a device. Although primarily described with reference to an asynchronous SRAM, the present parallel test scheme is generally applicable for use in a variety of asynchronous memory devices. For example, the present scheme may find application in programmable logic devices which use SRAM or other memory cells. In addition, processors which include on-chip and/or off-chip cache memories may utilize the present scheme where such cache memories are asynchronous in nature. Accordingly, the following description should be regarded as illustrative (and not restrictive) in nature.

Figure 1:
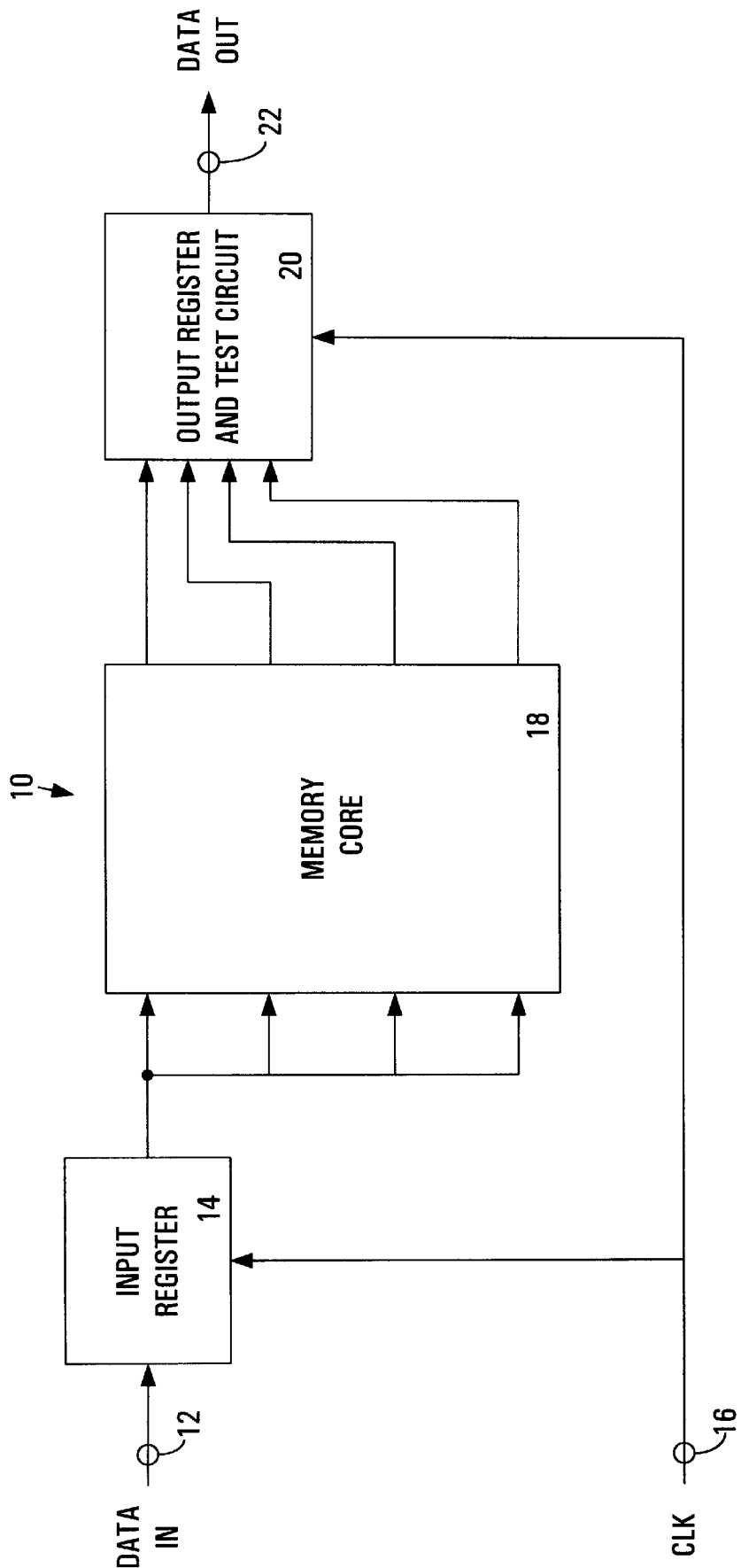
FIG. 1 illustrates a conventional parallel test scheme for a synchronous memory device.
Figure 2:
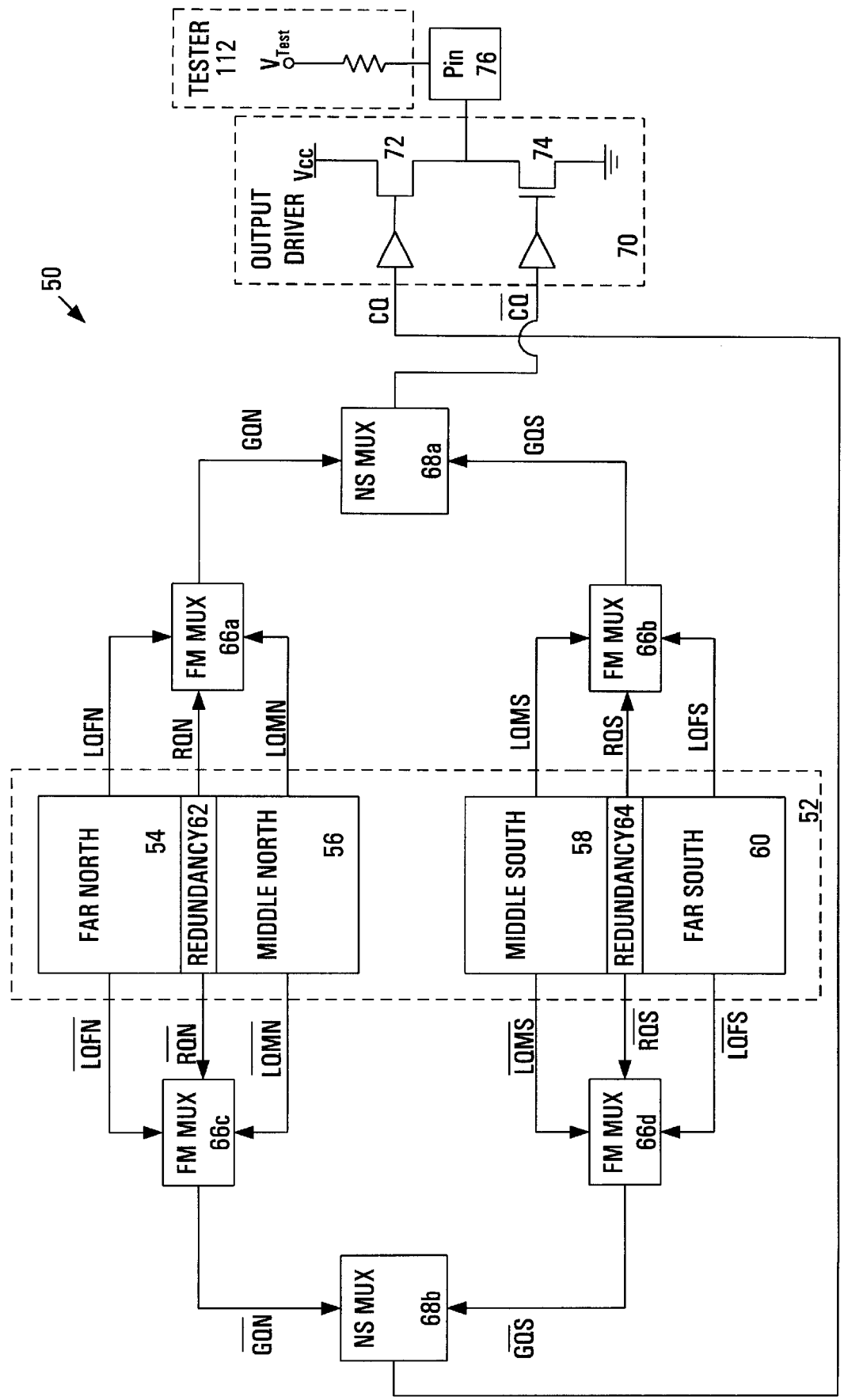
FIG. 2 illustrates a parallel test scheme for an asynchronous memory device in accordance with one embodiment of the present invention.

FIG. 2 illustrates an asynchronous memory device configured in accordance with an embodiment of the present invention. More particularly, FIG. 2 illustrates an asynchronous SRAM 50. Memory 50 is configured with parallel test circuitry which, as indicated above, can significantly reduce the time required to test the memory cells of memory 50. In additional to providing functional testing of these cells, the parallel test circuitry of memory 50 is configured to provide a measure of the access time of a slowest cell or bit. This is accomplished in this embodiment by utilizing the regular read path circuitry of memory 50 during a parallel test operation. Such circuitry necessarily provides output signals from the memory core of memory 50 at the speed of a regular read operation and, therefore, necessarily allows for testing the access time of the memory 50.

For this embodiment, memory 50 includes a memory core 52 arranged as North and South blocks, each block having a Far and a Middle quarter. Thus, memory core 52 includes Far North quarter 54, Middle North quarter 56, Middle South quarter 58 and Far South quarter 60. Also included in memory core 52 are North and South redundant blocks 62 and 64, respectively. North and South redundant blocks 62 and 64 (which may be arranged as redundant rows and/or columns) include memory cells which may be used to replace defective memory cells located in other quarters of memory core 52. Although not shown in individual detail, it should be appreciated that memory core 52 is made up of a number of individual memory cells, which may be conventional SRAM cells.

During a parallel test operation, test data is written to selected cells of memory core 52 by simultaneously activating multiple memory blocks, for example as described in U.S. Pat. No. 5,383,157. The data stored in these selected cells is read out and compared to the expected state as applied by the tester. This provides the functional test of the cells.

The parallel test circuitry for accomplishing the parallel test includes Far-Middle Multiplexers (FM MUX) 66a–66d and North-South Multiplexers (NS MUX) 68a–68b. In this context, the term multiplexer is used to describe the actions of the FM MUXs 66a–66d which receive logic signals from selected cells of respective quarters of memory core 52 and provide output signals indicative of the logic states of these cells. For example, FM MUX 66a may receive logic signal LQFN from a selected cell within Far-North quarter 54 and logic signal LQMN from a selected cell within Middle-North quarter 56. The logic complements of these signals (e.g., $\overline{\text{LQFN}}$ and $\overline{\text{LQMN}}$) are received by FM MUX 66c. Logic signals LQFN and $\overline{\text{LQFN}}$ correspond to the true and complement states of a selected memory cell within Far-North quarter 54 (e.g., as may be provided to true and complement bit lines coupled to a conventional SRAM cell). Similarly, logic signals LQMN and $\overline{\text{LQMN}}$ correspond to the true and complement states of a selected cell in Middle-North quarter 56. Thus, each FM MUX 66a and 66c receives true or complement, respectively, logic signals from selected cells of Far- and Middle-North quarters 54 and 56.

Because the same data is written to the selected cells of Far- and Middle-North quarters 54 and 56, the logic states of signals LQFN and LQMN should be the same when read by FM MUX 66a. That is, if a logic "1" is written to the selected cells, signals LQFN and LQMN should both indicate that a "1" was stored in the selected cells when these signals are read by FM MUX 66a (at least if these selected cells are functioning properly). Similarly, the logic states of signals $\overline{\text{LQFN}}$ and $\overline{\text{LQMN}}$ should be the same when read by FM MUX 66c. The output signals GQN and $\overline{\text{GQN}}$ produced by FM MUX 66a and 66c, respectively, are indicative of the logic states of the selected cells which provided logic signal pairs LQFN/$\overline{\text{LQFN}}$ and LQMN/$\overline{\text{LQMN}}$.

In a similar fashion, FM MUX 66b provides output signal GQS from logic signals LQMS and LQFS. FM MUX 66d provides output signal $\overline{\text{GQS}}$ from logic signals $\overline{\text{LQMS}}$ and $\overline{\text{LQFS}}$. Logic signal pair LQMS/$\overline{\text{LQMS}}$ corresponds to a selected cell in Middle-South quarter 58 while logic signal pair LQFS/$\overline{\text{LQFS}}$ corresponds to a selected cell in Far-South quarter 60.

Where redundancy is used, any of the logic signals LQFN or LQMN may be replaced by a logic signal RQN from redundant block 62. In such a case, corresponding logic signals $\overline{\text{LQFN}}$ or $\overline{\text{LQMN}}$ will be replaced by logic signal $\overline{\text{RQN}}$. Similarly, if redundancy is used in the South block of memory core 52, any of signals LQMS or LQFS may be replaced by signal RQS and a corresponding signal $\overline{\text{RQS}}$ will replace any of logic signals $\overline{\text{LQMS}}$ or $\overline{\text{LQFS}}$.

Signals GQN and GQS are provided to NS MUX 68a which is configured to produce an output signal $\overline{\text{CQ}}$. Output signal $\overline{\text{CQ}}$ is indicative of the logic states of signals GQN and GQS and is not merely a selection of one of these signals. Likewise, NS MUX 68b receives signals $\overline{\text{GQN}}$ and $\overline{\text{GQS}}$ and produces output signal CQ which is indicative of the logic states of $\overline{\text{GQN}}$ and $\overline{\text{GQS}}$.

Signals CQ and $\overline{\text{CQ}}$ are applied as input signals to output driver 70 which includes n-channel transistors 72 and 74. Output driver 70 is activated in response to these input signals and, depending on the respective states of these signals, will either drive the logic state of output pin 76 high or low (i.e., to a logic "1" or "0"). In some cases, where signals CQ and $\overline{\text{CQ}}$ are both at logic low, pin 76 will be undriven and therefore in a high impedance state. These various voltage levels (high, low and high impedance) are indicative of whether the selected cells of memory core 52 accessed during the parallel test have functioned correctly (e.g., have stored the proper state of the test signal) or have failed. Where each of the four selected cells have stored the same logic state, a logic 1 or 0 (depending on the logic state of the signal written to the selected cells) will be obtained at pin 76. Where one of the cells has stored a different logic state than the others, pin 76 will be set to high impedance. To determine which of the cells has stored the different logic state (i.e., which of the cells failed), each of the four selected cells may be tested on an individual basis, as in conventional testing operations.

Because FM MUXs 66a–66d and NS MUXs 68a–68b also form part of the regular read path circuitry for memory 50, the speed at which an output signal appears at pin 76 in response to a read command during the parallel test is the same as for a regular read operation. Thus, the parallel test circuitry is automatically configured to provide a measure of the slowest cell or bit access time of memory core 52. Between accesses of different locations, the output at pin 76 is set to high impedance (e.g., using circuitry not shown). In response to a read command (e.g., as indicated using conventional read and/or chip select signals), a timer may be started. The time which elapses from the moment the read command is initiated to the point at which the voltage at pin 76 is recognized as a logic 1 or 0 (which need not necessarily be a fill rail voltage) is the time for the slowest bit of the four selected cells. For the entire memory 50, the slowest such time for all of the cells of memory core 52 may be regarded as the read access time of the memory 50.

Figure 3:
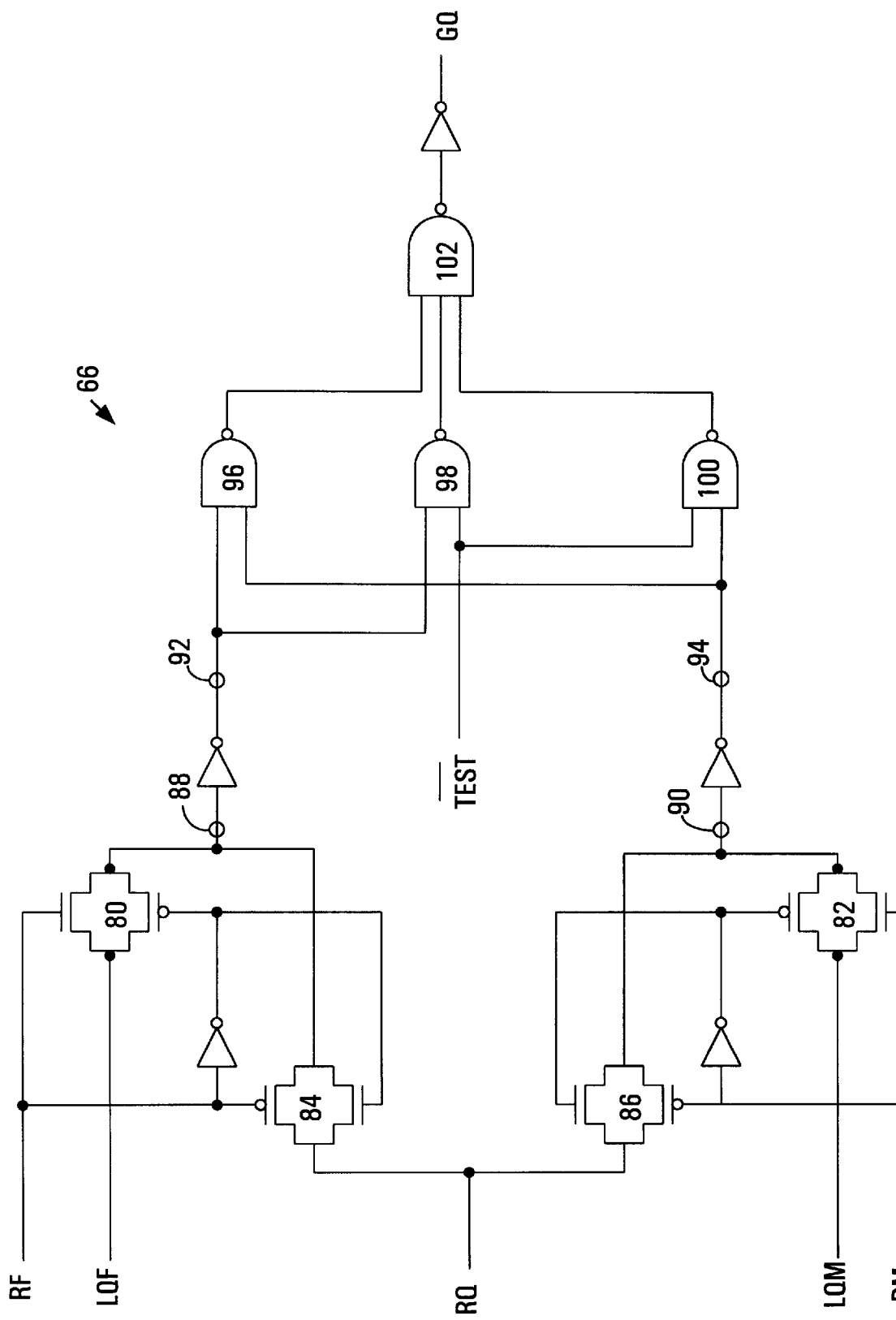
FIG. 3 illustrates a far-middle multiplexer configured for use in the parallel test scheme of FIG. 2.

The operation of the FM MUXs 66a–66d is explained further with reference to FIG. 3 which illustrates an FM MUX 66. FM MUX 66 may be any of FM MUXs 66a–66d and is shown as receiving input signals LQF and LQM which may correspond to any of signal pairs LQFN/LQMN, LQFS/LQMS, $\overline{\text{LQFN}}$/$\overline{\text{LQMN}}$ or $\overline{\text{LQFS}}$/$\overline{\text{LQMS}}$ of FIG. 2. Similarly, signal RQ shown in FIG. 3 may correspond to any of signals RQN, RQS, $\overline{RQN}$ or $\overline{RQS}$. Signals RF and RM are used to indicate whether redundancy has been used. There are distinct RFN and RMN used in 66a and 66c of FIG. 2 as well as RFS and RMS used in 66b and 66d of FIG. 2. If cells corresponding to signal LQF have been replaced by redundant cells, RF is active low. Similarly, if cells corresponding to signal LQM have been replaced by redundant cells, signal RM is active low.

Consider the case where no redundancy is used (RF and RM are logic high). Signals LQF and LQM are received at FM MUX 66 along input paths including transmission gates 80 and 82, respectively. Because redundancy is not used, transmission gates 84 and 86 block signal RQ. The outputs of transmission gates 80 and 82, signals 88 and 90, respectively, are logically inverted to form signals 92 and 94, respectively. These signals, along with signal $\overline{TEST}$ (this signal is forced to a logic "0" in test mode and a logic "1" in normal mode), are applied as inputs to NAND gates 96, 98 and 100. The outputs of NAND gates 96, 98 and 100 are applied as inputs to NAND gate 102 and the output of NAND gate 102 is logically inverted to form output signal GQ. Signal GQ corresponds to any of signals GQN, GQS, $\overline{GQN}$ and $\overline{GQS}$ of FIG. 2.

For a case where redundancy is used, e.g., if signal RQ is used in place of signal LQF, RM will be active low and transmission gate 84 will allow signal RQ to be passed along the input path of FM MUX 66 as input signal 88. In such a case, transmission gate 80 will block signal LQF. If the redundancy is such that signal RQ is to replace signal LQM, signal RM will be active low. This will allow transmission gate 86 to provide signal RQ along the input path as signal 90. At the same time, transmission gate 82 will block signal LQM.

By way of example, consider the situation where FM MUX 66 represents FM MUX 66a of FIG. 2 and no redundancy is used. In this case, signal LQF corresponds to signal LQFN from Far-North quarter 54 and signal LQM corresponds to signal LQMN from Middle-North quarter 56. Assume that a logic 0 has been written to the selected cells which provide these signals. Thus, LQF and LQM are logic low and in test mode signal $\overline{TEST}$ is logic low. Given the states of signal LQF and LQM, signals 92 and 94 are both logic high. Thus, the output from NAND gate 96 is logic low, the output of NAND gates 98 and 100 are each logic high and the output of NAND gate 102 is logic high. Signal GQ is thus logic low. This and other combinations of input and resulting output signals for FM MUX 66 are given in Table 1.

When FM MUX66 now represents FM MUX66c, the truth table of Table 2 applies. Thus for Table 1 and Table 2, a GQ and $\overline{GQ}$ signal can only reach a logic "0" if both of the input logic signals to be compared are also at "0". Now since all the local data lines, LQ, $\overline{LQ}$, RQ and $\overline{RQ}$ go high between data transitions, it is the later of the lines to transition to "0" which determines the speed of the GQ/$\overline{GQ}$ global data lines.

TABLE 1

|  | LQF | LQM | RQ | RM | RF | $\overline{TEST}$ | GQ |
|---|---|---|---|---|---|---|---|
| Redundancy Used | X | 1 | 1 | 1 | 0 | 0 | 1 |
|  | X | 1 | 0 | 1 | 0 | 0 | 1 |
|  | X | 0 | 1 | 1 | 0 | 0 | 1 |
|  | X | 0 | 0 | 1 | 0 | 0 | 0 |
|  | 1 | X | 1 | 0 | 1 | 0 | 1 |
|  | 1 | X | 0 | 0 | 1 | 0 | 1 |
|  | 0 | X | 1 | 0 | 1 | 0 | 1 |

TABLE 1-continued

|  | LQF | LQM | RQ | RM | RF | $\overline{TEST}$ | GQ |
|---|---|---|---|---|---|---|---|
|  | 0 | X | 0 | 0 | 1 | 0 | 0 |
| Redundancy Not Used | 1 | 1 | X | 1 | 1 | 0 | 1 |
|  | 1 | 0 | X | 1 | 1 | 0 | 1 |
|  | 0 | 1 | X | 1 | 1 | 0 | 1 |
|  | 0 | 0 | X | 1 | 1 | 0 | 0 |

Key:
X = do not care
1 = logic high
0 = logic low

TABLE 2

|  | $\overline{LQF}$ | $\overline{LQM}$ | $\overline{RQ}$ | RM | RF | TEST | $\overline{GQ}$ |
|---|---|---|---|---|---|---|---|
| Redundancy Used | X | 0 | 0 | 1 | 0 | 0 | 0 |
|  | X | 0 | 1 | 1 | 0 | 0 | 1 |
|  | X | 1 | 0 | 1 | 0 | 0 | 1 |
|  | X | 1 | 1 | 1 | 0 | 0 | 1 |
|  | 0 | X | 0 | 0 | 1 | 0 | 0 |
|  | 0 | X | 1 | 0 | 1 | 0 | 1 |
|  | 1 | X | 0 | 0 | 1 | 0 | 1 |
|  | 1 | X | 1 | 0 | 1 | 0 | 1 |
| Redundancy Not Used | 0 | 0 | X | 1 | 1 | 0 | 0 |
|  | 0 | 1 | X | 1 | 1 | 0 | 1 |
|  | 1 | 0 | X | 1 | 1 | 0 | 1 |
|  | 1 | 1 | X | 1 | 1 | 0 | 1 |

Figure 4:
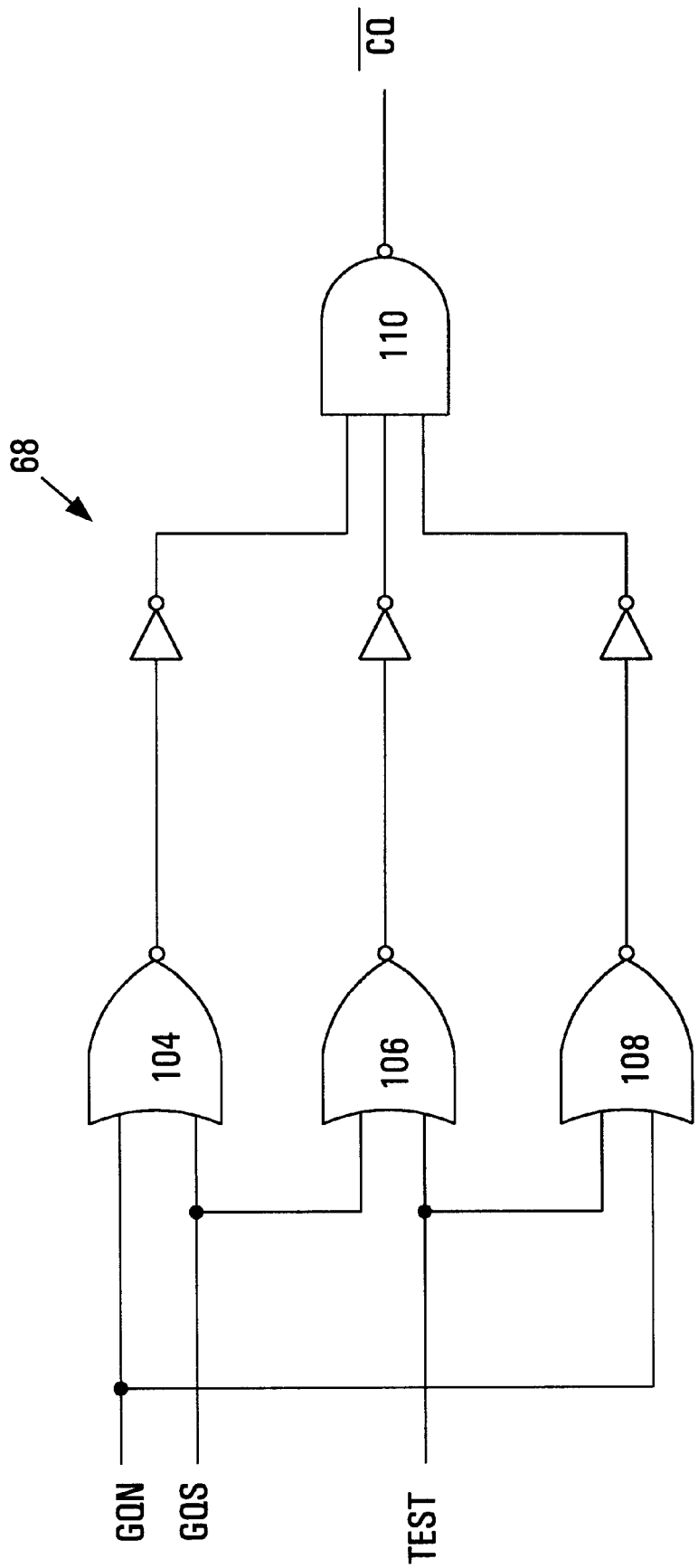
FIG. 4 illustrates a north-south multiplexer configured for use in the parallel test scheme of FIG. 2.

FIG. 4 illustrates an NS MUX 68. NS MUX 68 may be either of NS MUX 68a or 68b. Input signals may correspond to any of signals GQN, GQS, $\overline{GQN}$ and $\overline{GQS}$ of FIG. 2. Output signals may correspond to either of signals $\overline{CQ}$ or CQ. Signal TEST is forced to a logic "1" in test mode and to a logic "0" in normal mode. As shown, NS MUX 68 is configured to receive the output signals from a pair of FS MUXs 66 and to produce the output signal therefrom. The state of the output signal is indicative of the logic states of the input signals GQN and GQS.

Input signals GQN and GQS and signal TEST are applied to the inputs of NOR gates 104, 106 and 108 as shown. The respective outputs of these signals are logically inverted and applied as inputs to NAND gate 110. The output of NAND gate 110 is signal $\overline{CQ}$. Table 3 gives the states of output signal $\overline{CQ}$ for various combinations of input signal GQN and GQS while Table 4 gives the states of signal CQ for various inputs $\overline{GQN}$ and $\overline{GQS}$.

TABLE 3

| GQN | GQS | TEST | $\overline{CQ}$ |
|---|---|---|---|
| 0 | 0 | 1 | 1 |
| 1 | 0 | 1 | 0 |
| 0 | 1 | 1 | 0 |
| 1 | 1 | 1 | 0 |

TABLE 4

| $\overline{GQN}$ | $\overline{GQS}$ | TEST | CQ |
|---|---|---|---|
| 1 | 1 | 1 | 0 |
| 0 | 1 | 1 | 0 |
| 1 | 0 | 1 | 0 |
| 0 | 0 | 1 | 1 |

Returning to FIG. 2, a complete parallel test sequence is accomplished as follows. First, selected cells in each of the quarters 54, 56, 58 and 60 are written with data. For example, the cells may be written with a logic 1. The selected cells are then tested by reading out the stored values from the selected cells using the above described parallel test circuitry. For example, assuming all of the selected cells properly stored a logic 1, and no redundancy was used, signals LQFN, LQMN, LQMS and LQFS will each be logic high. Thus, the respective output signals GQN and GQS of FM MUXs 66*a* and 66*b* will be logic high (see Table 1). Signals GQN and GQS will be received by NS MUX 68*a* which will produce a logic low output signal $\overline{CQ}$ (see Table 3). The logic low output signal $\overline{CQ}$ is buffered and applied to the gate of transistor 74, turning this transistor off and decoupling pin 76 from the voltage source ground.

At the same time, signals $\overline{LQFN}$, $\overline{LQMN}$, $\overline{LQFS}$ and $\overline{LQMS}$ are logic low.

These signals are received by FM MUXs 66*c* and 66*d* which produce logic low output signals $\overline{GQN}$ and $\overline{GQS}$ in response (see Table 1). Signals $\overline{GQN}$ and $\overline{GQS}$ are received by NS MUX 68*b* which produces logic high output signal CQ in response (see Table 4). Logic high output signal CQ is buffered and is applied to the gate of transistor 72, turning on this transistor and pulling the voltage at pin 76 to a logic high potential. A valid logic potential on pin 76 indicates that all four selected cells in memory core 52 have stored this same logic state. Thus for Table 3 and Table 4, a CQ or $\overline{CQ}$ signal can only reach a logic "1" if both of the input logic signals to be compared are at "0". Now since all the global data lines, GQ, $\overline{GQ}$ go high between data transitions, it is the later of the lines to transition to "0" which determines the speed of the CQ/$\overline{CQ}$ combined data lines. Also since the output pad 76 is at high impedance or undriven between transitions it is the CQ or $\overline{CQ}$ signal going high which drives the output pad to a "1" or a "0" at the access time of the slowest bit. These cells would pass the functional or timing test if this state matches the state expected by the tester 112.

As a second example, consider the case where a selected cell of Far-North quarter 54 fails to store the correct logic value of the test signal. That is, assume that the selected cell of Far-North block 54 stores a logic 0 when a logic 1 is written to memory core 52 while the other selected cells of the remaining quarters properly store a logic 1. In this case, during the read test signal LQFN will be a logic low while signals LQMN, LQMS and LQFS will be logic high. The resulting signals GQN and GQS from PS MUXs 66*a* and 66*b* will be logic high (see Table 1). These signals are received by NS MUX 68*a* and a resulting logic low output signal $\overline{CQ}$ is produced. As a result, pin 76 is decoupled from ground.

At the same time, signal $\overline{LQFN}$ is logic high, while signals $\overline{LQMN}$, $\overline{LQFS}$ and $\overline{LQMS}$ are logic low. Accordingly, signal $\overline{GQN}$ from FM MUX 66*c* is logic high while signal $\overline{GQS}$ from FM MUXs 66*d* is logic low (see Table 1). As a result, signal CQ from NS MUX 68*b* is logic low, turning off transistor 72. Because both transistors 72 and 74 of output driver 70 are off, the voltage at pin 76 is at high impedance.

Tester 112 may be a conventional SRAM test device. These testers commonly couple the output pins of a memory device under test to a test voltage (e.g., $V_{test}$). In accordance with the present invention, the test voltage is set at a voltage potential (e.g., 1.73 V). If the selected cells of memory core 52 all store the same logic state, the voltage at pin 76 will be pulled to a logic high or low potential (as described above). However, if one or more of the selected cells stores an incorrect logic state, transistors 72 and 74 will both be off, and the voltage at pin 76 will remain at approximately 1.73 V. This is an indication that at least one of the cells has failed to store the correct logic state and that each of the cells currently undergoing testing should be individually tested to determine which has/have failed. Note that if all 4 cells have the wrong state the output will be driven to this same state. This will be detected by the tester as the opposite of the expected data. This scheme is therefore regarded as superior to the conventional approach of XOR gate plus flag which would not be capable of detecting such a failure.

Thus, a parallel test scheme for an asynchronous memory device such as a memory has been described. Although the foregoing description was set forth with reference to certain illustrated embodiments, it should be appreciated that the present invention is in no way limited to these examples. For example, certain logic gates discussed with reference to the exemplary embodiments may be replaced with equivalent combinations of logic gates as is well known in the art. Accordingly, the invention should only be measured in terms of the claims which follow.

What is claimed is:

1. An asynchronous memory device comprising parallel test circuitry configured to provide a measure of a slowest cell access time for the programmable device the parallel test circuitry including:

first circuitry configured to receive logic signals from a plurality of cells of the memory and to provide first output signals indicative of logic states of the plurality of cells; and second circuitry configured to receive the first output signals and to produce second output signals indicative of the logic states of the first output signals therefrom.

2. The asynchronous memory device of claim 1 wherein the device is a static random access memory.

3. The asynchronous memory device of claim 1 wherein at least one of the plurality of cells is included within a redundant column of the memory.

4. The asynchronous memory device of claim 1 wherein the first circuitry comprises one or more circuits, each including first and second input paths from a first number of the plurality of cells and first logic circuitry coupled thereto, the first logic circuitry configured to provide the first output signals.

5. The asynchronous memory device of claim 4 wherein the second circuitry comprises second logic circuitry configured to receive the first output signals and a test signal and to provide the second output signals.

6. The asynchronous memory device of claim 1 further comprising output driver circuitry coupled to receive the second output signals and configured to provide a third output signal in response thereto.

7. Parallel test circuitry, comprising:

first and second input paths configured to receive logic signals from first and second cells of an asynchronous memory device, respectively; and logic circuitry coupled to said first and second input paths and configured to produce an output signal indicative of logic states stored in said first and second cells, wherein the first and second input paths each comprise transmission gates coupled to receive logic signals from one of the first or second cells and a logic signal from a redundant cells of the asynchronous memory device, the transmission gates being responsive to signals indicative of whether redundancy is used.

8. The parallel test circuitry of claim 7 wherein the parallel test circuitry further comprises read path circuitry for the asynchronous memory device.

9. The parallel test circuitry of claim 7 wherein the logic circuitry comprises a plurality of logic gates arranged to receive logic signals from the first and second input paths and one or more test signals indicative of logic states written to the first and second cells.

* * * * *